(12) United States Patent
Bangsaruntip et al.

(10) Patent No.: US 8,723,162 B2
(45) Date of Patent: May 13, 2014

(54) NANOWIRE TUNNEL FIELD EFFECT TRANSISTORS

(75) Inventors: Sarunya Bangsaruntip, Mount Kisco, NY (US); Isaac Lauer, Mahopac, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/541,022

(22) Filed: Jul. 3, 2012

(65) Prior Publication Data

US 2012/0273761 A1 Nov. 1, 2012

Related U.S. Application Data

(63) Continuation of application No. 12/778,315, filed on May 12, 2010, now Pat. No. 8,324,030.

(51) Int. Cl.
*H01L 29/06* (2006.01)

(52) U.S. Cl.
USPC ............................................. 257/38; 438/151

(58) Field of Classification Search
USPC ............ 257/38, 296, 368, E21.409, E21.471; 438/151
See application file for complete search history.

(56) References Cited

U.S. PATENT DOCUMENTS

| | | | |
|---|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |
| 6,653,209 B1 | 11/2003 | Yamagata |
| 6,806,141 B2 | 10/2004 | Kamins |

(Continued)

FOREIGN PATENT DOCUMENTS

| | | | |
|---|---|---|---|
| EP | 217811 A1 | 4/2010 |
| KR | 20090044799 A | 5/2009 |
| WO | 02084757 A1 | 10/2002 |
| WO | WO2008069765 A1 | 6/2008 |

OTHER PUBLICATIONS

Alexander J. Gates, "Designing a Nanoelectronic Circuit to Control a Millimeter-scale Walking Robot," Mitre Technical Paper, Aug. 2004, http://www.mitre.org/work/tech_papers/tech_papers_04/04_1248/04_1248.pdf; 21 pages.

(Continued)

*Primary Examiner* — Shaun Campbell
(74) *Attorney, Agent, or Firm* — Cantor Colburn LLP; Vazken Alexanian

(57) ABSTRACT

A nanowire tunnel field effect transistor (FET) device includes a channel region including a silicon portion having a first distal end and a second distal end, the silicon portion is surrounded by a gate structure disposed circumferentially around the silicon portion, a drain region including an doped silicon portion extending from the first distal end, a portion of the doped silicon portion arranged in the channel region, a cavity defined by the second distal end of the silicon portion and an inner diameter of the gate structure, and a source region including a doped epi-silicon portion epitaxially extending from the second distal end of the silicon portion in the cavity, a first pad region, and a portion of a silicon substrate.

20 Claims, 4 Drawing Sheets

(56) References Cited

U.S. PATENT DOCUMENTS

| | | |
|---|---|---|
| 6,835,618 B1 | 12/2004 | Dakshina-Murthy et al. |
| 6,855,606 B2 | 2/2005 | Chen et al. |
| 6,882,051 B2 | 4/2005 | Majumdar et al. |
| 6,891,227 B2 | 5/2005 | Appenzeller et al. |
| 6,903,013 B2 | 6/2005 | Chan et al. |
| 6,996,147 B2 | 2/2006 | Majumdar et al. |
| 7,101,762 B2 | 9/2006 | Cohen et al. |
| 7,151,209 B2 | 12/2006 | Empedocles et al. |
| 7,180,107 B2 | 2/2007 | Appenzeller et al. |
| 7,211,853 B2 | 5/2007 | Bachtold et al. |
| 7,253,060 B2 | 8/2007 | Yun et al. |
| 7,297,615 B2 | 11/2007 | Cho et al. |
| 7,311,776 B2 | 12/2007 | Lin et al. |
| 7,443,025 B2 | 10/2008 | Verbist |
| 7,446,025 B2 | 11/2008 | Cohen et al. |
| 7,449,373 B2 | 11/2008 | Doyle et al. |
| 7,452,759 B2 | 11/2008 | Sandhu |
| 7,452,778 B2 | 11/2008 | Chen et al. |
| 7,456,068 B2 | 11/2008 | Kavalieros et al. |
| 7,456,476 B2 | 11/2008 | Hareland et al. |
| 7,473,943 B2 | 1/2009 | Mostarshed et al. |
| 7,498,211 B2 | 3/2009 | Ban et al. |
| 7,534,675 B2 | 5/2009 | Bangsaruntip et al. |
| 7,550,333 B2 | 6/2009 | Shah et al. |
| 7,569,941 B2 | 8/2009 | Majumdar et al. |
| 7,642,578 B2 | 1/2010 | Lee et al. |
| 7,791,144 B2 | 9/2010 | Chidambarrao et al. |
| 7,795,677 B2 | 9/2010 | Bangsaruntip et al. |
| 7,799,657 B2 | 9/2010 | Dao |
| 7,803,675 B2 | 9/2010 | Suk et al. |
| 7,834,345 B2 | 11/2010 | Bhuwalka et al. |
| 7,871,870 B2 | 1/2011 | Mostarshed et al. |
| 7,893,506 B2 | 2/2011 | Chau et al. |
| 8,064,249 B2 | 11/2011 | Jang et al. |
| 8,097,515 B2 | 1/2012 | Bangsaruntip et al. |
| 8,154,127 B1 | 4/2012 | Kamins et al. |
| 8,338,280 B2 | 12/2012 | Tan et al. |
| 8,541,774 B2 | 9/2013 | Bangsaruntip et al. |
| 2004/0149978 A1 | 8/2004 | Snider |
| 2004/0166642 A1 | 8/2004 | Chen et al. |
| 2005/0121706 A1 | 6/2005 | Chen et al. |
| 2005/0266645 A1 | 12/2005 | Park |
| 2005/0275010 A1 | 12/2005 | Chen et al. |
| 2006/0033145 A1 | 2/2006 | Kakoschke et al. |
| 2006/0131665 A1 | 6/2006 | Murthy et al. |
| 2006/0138552 A1 | 6/2006 | Brask et al. |
| 2006/0197164 A1 | 9/2006 | Lindert et al. |
| 2007/0001219 A1 | 1/2007 | Radosavljevic et al. |
| 2007/0267619 A1 | 11/2007 | Nirschl |
| 2007/0267703 A1 | 11/2007 | Chong et al. |
| 2007/0284613 A1 | 12/2007 | Chui et al. |
| 2008/0014689 A1 | 1/2008 | Cleavelin et al. |
| 2008/0061284 A1 | 3/2008 | Chu et al. |
| 2008/0067495 A1 | 3/2008 | Verhulst |
| 2008/0067607 A1 | 3/2008 | Verhulst et al. |
| 2008/0079041 A1 | 4/2008 | Suk et al. |
| 2008/0085587 A1 | 4/2008 | Wells et al. |
| 2008/0121932 A1 | 5/2008 | Ranade |
| 2008/0128760 A1 | 6/2008 | Jun et al. |
| 2008/0135949 A1 | 6/2008 | Lo et al. |
| 2008/0142853 A1 | 6/2008 | Orlowski |
| 2008/0149914 A1 | 6/2008 | Samuelson et al. |
| 2008/0149997 A1 | 6/2008 | Jin et al. |
| 2008/0150025 A1 | 6/2008 | Jain |
| 2008/0179752 A1 | 7/2008 | Yamauchi et al. |
| 2008/0191196 A1 | 8/2008 | Lu et al. |
| 2008/0224224 A1 | 9/2008 | Vandenderghe et al. |
| 2008/0227259 A1 | 9/2008 | Avouris et al. |
| 2008/0246021 A1 | 10/2008 | Suk et al. |
| 2008/0247226 A1 | 10/2008 | Liu et al. |
| 2008/0290418 A1 | 11/2008 | Kalburge |
| 2009/0026553 A1 | 1/2009 | Bhuwalka et al. |
| 2009/0057650 A1 | 3/2009 | Lieber et al. |
| 2009/0057762 A1 | 3/2009 | Bangsaruntip et al. |
| 2009/0061568 A1 | 3/2009 | Bangsaruntip et al. |
| 2009/0090934 A1 | 4/2009 | Tezuka et al. |
| 2009/0134467 A1 | 5/2009 | Ishida et al. |
| 2009/0149012 A1 | 6/2009 | Brask et al. |
| 2009/0181477 A1 | 7/2009 | King et al. |
| 2009/0217216 A1 | 8/2009 | Lee et al. |
| 2009/0294864 A1 | 12/2009 | Suk et al. |
| 2010/0140589 A1 | 6/2010 | Ionescu |
| 2010/0193770 A1 | 8/2010 | Bangsaruntip et al. |
| 2010/0207102 A1 | 8/2010 | Lee et al. |
| 2011/0133169 A1 | 6/2011 | Bangsaruntip et al. |
| 2011/0147840 A1 | 6/2011 | Cea et al. |
| 2012/0146000 A1 | 6/2012 | Bangsaruntip et al. |
| 2013/0001517 A1 | 1/2013 | Bangsaruntip et al. |

OTHER PUBLICATIONS

Andriotis et al., Realistic nanotube-metal contact configuration for molecular electronics applications, IEEE Sensors Journal, vol. 8, No. 6, Jun. 2008; 4 pages.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jult 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

Hu et al., 'Fringing field effects on electrical resistivity of semiconductor nanowire-metal contacts', Applied Physics Letters 92, 083503_2008; 3 pages.

International Search Report; International Application No. PCT/US2011/029304; International Filing Date: Mar. 22, 2011; Date of Mailing: May 20, 2011; 7 pages.

Jie Xiang et al., "Ge/Si Nanowire Heterostructures as High-Performance Field-Effect Transistors," Nature 441, pp. 489-493 (May 25, 2006).

Knoch et al., 'Tunneling phenomena in carbon nanotube field-effect transistors', Phys Stat Sol. (a) 205, No. 4, 679-694 (2008).

Leonard et ai., 'Size-dependent effects on electrical contacts to nanotubes and nanowires', Phys Rev Lett., Jul. 14, 2006; 97(2):026804; pp. 026804-1 through 026804-4.

M.M. Ziegler et al., "The CMOS/NANO Interface from a Circuits Perspective," ISCAS '03. Proceedings of the 2003 International Symposium on Circuits and Systems, 2003, pp. 25-28 May 2003, vol. 4, pp. IV-904-IV-907.

M. T. Bjork et al., "Silicon Nanowire Tunneling Field-Effect Transistors," Applied Physics Letters 92, 193504 (2008); pp. 193504-1 through 193504-3.

Ma et al., 'High-performance nanowire complementary metal-semiconductor inverters', Applied Physics Letters 93, 053105_2008; pp. 053105-1 through 053105-3.

Saumitra Raj mehrotra, A Simulation Study of Silicom Nanowire Field Effect Transistors (FETs), University of Cincinnati, Jul. 2007; 145 pages.

Lauhon et al., 'Epitaxial core-shell and core-multishell nanowire heterostructures', Nature, vol. 420, Nov. 7, 2002, pp. 57-61.

International Search Report; International Application No. PCT/EP2010/066961; International Filing Date: Nov. 8, 2010; Date of Mailing: Feb. 10, 2011; 6 pages.

International Search Report; International Application No. PCT/EP2010/066483; International Filing Date: Oct. 29, 2010; Date of Mailing: Feb. 7, 2011; 6 pages.

International Search Report—Written Opinion; International Application No. PCT/EP2010/066483; International Filing Date: Oct. 29, 2010; Date of Mailing: Feb. 7, 2011; 10 pages.

(56) References Cited

OTHER PUBLICATIONS

International Search Report; International Application No. PCT/US11/49501; International Filing Date: Aug. 29, 2011; Date of Mailing: Jan. 18, 2012; 6 pages.
International Search Report—Written Opinion; International Application No. PCT/EP2010/066961; International Filing Date: Nov. 8, 2010; Date of Mailing: Feb. 10, 2011; 9 pages.
International Search Report Written Opinion; International Application No. PCT/US11/49501; International Filing Date: Aug. 29, 2011; Date of Mailing: Jan. 18, 2012; 4 pages.
Pavanello et al., "Evaluation of Triple-Gate FinFETs with SiO2—HfO2—TiN Gate Stack Under Analog Operation," Solid State Electronics, Elsevier Science Publishers, Barking, GB, vol. 51, No. 2, Mar. 7, 2007, pp. 285-291.
Singh et al., 'Si, SiGe Nanowire Devices by Top-Down Technology and Their Applications', IEEE Transactions on Electron Devices, vol. 55, No. 11, Nov. 2008, Cvr. pg. and pp. 3107-3118.
Taichi Su et al., "New Planar Self-Aligned Double-Gate Fully Depleted P-MOSFET's Using Epitaxial Lateral Overgrowth (ELO) and Selectively Grown Source/Drain (S/D)," 2000 IEEE International SOI Conference, Oct. 2000, copyright 2000 IEEE, pp. 110-111.
N. Checka, 'Circuit Architecture for 3D Integration', Chapter 13 in Wafer Level 3-D ICs Process Technology, ed. C.S. Tan, Springer US, 2008, ISBN 978-0-387-76534-1.
International Search Report—Written Opinion; International Application No. PCT/US2011/029304; International Filing Date: Mar. 22, 2011; Date of Mailing: May 20, 2011; 5 pages.
Chen et al., "An Integrated Logic Circuit Assembled ona Single Carbon Nanotube", www.sciencemag.org Science, vol. 311, Mar. 24, 2006, p. 1735.
Derycke, et al, "Carbon Nanotube Inter- and Intramolecular Logic Gates" Nano Letters, Sep. 2001, vol. 1, No. 9, pp. 453-456.
Office Action—Non-Final for U.S. Appl. No. 12/684,280, filed Jan. 8, 2010; First Named Inventor: Sarunya Bangsaruntip; Mailing Date: May 2, 2011.
Office Action—Non-Final for U.S. Appl. No. 12/778,315, filed May 12, 2010; First Named Inventor: Sarunya Bangsaruntip; Mailing Date: Mar. 26, 2012.
Office Action—Non-Final for U.S. Appl. No. 12/856,718, filed Aug. 16, 2010; first Named Inventor Sarunya Bangsaruntip; Mailing Date: Jul. 9, 2012.
Office Action—Non-Final for U.S. Appl. No. 12/776,485, filed May 10, 2010; Fist Named Inventor: Sarunya Bangsaruntip; Mailing Date: Feb. 21, 2012.
Office Action—Restriction Election for U.S. Appl. No. 12/684,280, filed Jan. 8, 2010; First Named Inventor: Sarunya Bangsaruntip; Mailing Date: Feb. 10, 2012.
Office Action—Restriction/Election for U.S. Appl. No. 12/758,939, filed Apr. 13, 2010; First Named Inventor: Sarunya Bangsaruntip; Mailing Date: Jun. 8, 2011.
Office Action—Final for U.S. Appl. No. 12/684,280, filed Jan. 8, 2010; First Namd Inventor: Sarunya Bangsaruntip; Mailing Date: Oct. 5, 2011.
Transmittal and International Preliminary Report on Patentability for International Application No. PCT/US2011/029304; International Filing Date: Mar. 22, 2011; date of mailing Oct. 26, 2012, 2 pages.

Notice of Allowance for U.S. Appl. No. 12/776,485, filed May 10, 2010; First Named Inventor: Sarunya Bangsaruntip; Mailing Date: Sep. 26, 2012.
Office Action—Final for U.S. Appl. No. 13/372,712, filed Feb. 14, 2012; First Named Inventor: Sarunya Bangsaruntip; Mailing Date: Sep. 4, 2012.
Office Action—Non-Final for U.S. Appl. No. 12/631,199, filed Dec. 4, 2009; First Named Inventor: Sarunya Bangsaruntip; Mailing Date: Jun. 13, 2012.
Office Action—Non-Final for U.S. Appl. No. 12/856,718, filed Aug. 16, 2010; First Named Inventor: Sarunya Bangsaruntip; Mailing Date: Jul. 9, 2012.
Office Action—Restriction-Election for U.S. Appl. No. 12/856,718, filed Aug. 16, 2010; First Named Inventor: Sarunya Bangsaruntip; Mailing Date: Apr. 9, 2012.
Written Opinion for International Application No. PCT/US2011/029304; International Filing Date: Mar. 22, 2011; mailing date: May 20, 2011; 5 pages.
Office Action—Notice of Allowance for U.S. Appl. No. 13/551,995, filed Jul. 18, 2012; First Named Inventtor: Sarunya Bangsaruntip; Mailing Date: Jul. 15, 2013; 13 pages.
International Search Report; International Application No. PCT/EP2011/053174; International Filing Date: Mar. 3, 2011; Date of Mailing: May 31, 2011; 3 pages.
International Search Report—Written Opinion; International Application No. PCT/EP2011/053174; International Filing Date: Mar. 3, 2011; Date of Mailing: May 31, 2011; 4 pages.
Office Action—Final for U.S. Appl. No. 12/856,718, filed Aug. 16, 2010; First Named Inventor: Sarunya Bangsaruntip; Mailing Date: Dec. 13, 2012.
Office Action—Final for U.S. Appl. No. 13/551,995, filed July 18, 2012; First Named Inventor: Sarunya Bangsaruntip; Mailing Date: Apr. 30, 2013; 11 pgs.
Office Action—Non-Final for U.S. Appl. No. 13/550,700, filed Jul. 17, 2012; First Named Inventor: Sarunya Bangsaruntip; Mailing Date: Apr. 25, 2013; 27 pgs.
Office Action—Non-Final for U.S. Appl. No. 13/556,300, filed Jul. 24, 2012; First Named Inventor: Sarunya Bangsaruntip; Mailing Date: Dec. 10, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 13/372,719, filed Feb. 14, 2012; First Named Inventor: Sarunya Bangsaruntip; Mailing Date: May 7, 2012.
Office Action—Non-Final for U.S. Appl. No. 13/372,719, filed Feb. 14, 2012; First Named Inventor: Sarunya Bangsaruntip; Mailing Date: Jul. 5, 2013, 28 pgs.
Office Action—Non-Final for U.S. Appl. No. 13/372,714, filed Feb. 14, 2012; Fist Named Inventor: Sarunya Bangsaruntip et al.; Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/884,707, filed Sep. 17, 2010; Fist Named Inventor: Sarunya Bangsaruntip et al.; Mailing Date: Oct. 2, 2012.
Office Action—Restriction Election for U.S. Appl. No. 12/776,485, filed May 10, 2010; First Named Inventor : Sarunya Bangsaruntip; Mailing Date: Dec. 9, 2011.

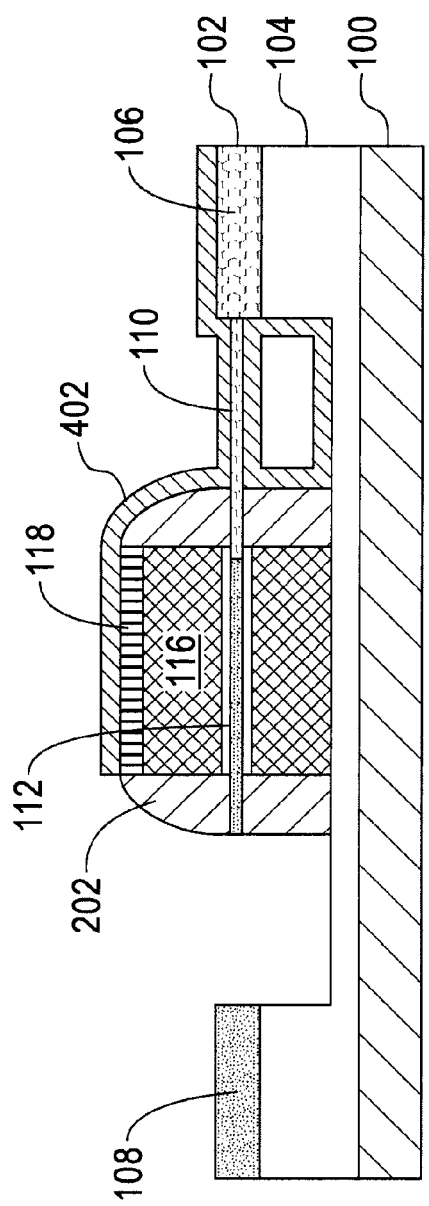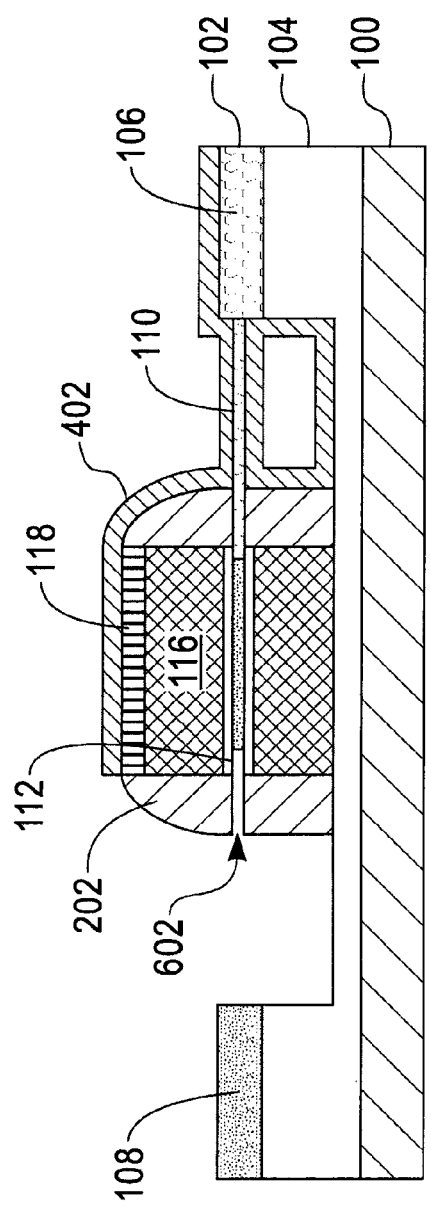

NANOWIRE TUNNEL FIELD EFFECT TRANSISTORS

CROSS-REFERENCE TO RELATED APPLICATIONS

This is a continuation application of application Ser. No. 12/778,315, filed May 12, 2010, U.S. Publication No. 2011-0278546 and published on Nov. 17, 2011.

FEDERAL RESEARCH STATEMENT

This invention was made with Government support under Government Contract No.: FA8650-08-C-7806 awarded by Defense Advanced Research Projects Agency (DARPA). The Government has certain rights in this invention.

FIELD OF INVENTION

The present invention relates to semiconductor nanowire tunnel field effect transistors.

DESCRIPTION OF RELATED ART

A nanowire tunnel field effect transistor (FET) includes doped portions of nanowire that contact the channel region and serve as source and drain regions of the device. The source region may include, p-type doped silicon material, while the drain region may include n-type doped silicon material.

BRIEF SUMMARY

According to one embodiment of the present invention, a nanowire tunnel field effect transistor (FET) device includes a channel region including a silicon portion having a first distal end and a second distal end, the silicon portion is surrounded by a gate structure disposed circumferentially around the silicon portion, a drain region including an n-type doped silicon portion extending from the first distal end, a cavity defined by the second distal end of the silicon portion and an inner diameter of the gate structure, and a source region including a doped epi-silicon portion epitaxially extending from the second distal end of the silicon portion in the cavity, a first pad region, and a portion of a silicon substrate.

According to another embodiment of the present invention, a nanowire tunnel field effect transistor (FET) device includes a channel region including a silicon portion having a first distal end and a second distal end, the silicon portion is surrounded by a gate structure disposed circumferentially around the silicon portion, a drain region including an n-type doped silicon portion extending from the first distal end, a portion of the n-type doped silicon portion arranged in the channel region, a cavity defined by the second distal end of the silicon portion and an inner diameter of the gate structure, and a source region including a doped epi-silicon portion epitaxially extending from the second distal end of the silicon portion in the cavity, a first pad region, and a portion of a silicon substrate.

According to yet another embodiment of the present invention, a nanowire tunnel field effect transistor (FET) device includes a channel region including a silicon portion having a first distal end and a second distal end, the silicon portion is surrounded by a gate structure disposed circumferentially around the silicon portion, a drain region including an doped silicon portion extending from the first distal end, a portion of the doped silicon portion arranged in the channel region, a cavity defined by the second distal end of the silicon portion and an inner diameter of the gate structure, and a source region including a doped epi-silicon portion epitaxially extending from the second distal end of the silicon portion in the cavity, a first pad region, and a portion of a silicon substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-8 illustrate an exemplary method for forming a tunnel field effect transistor (FET) device.

DETAILED DESCRIPTION

Figure 1:
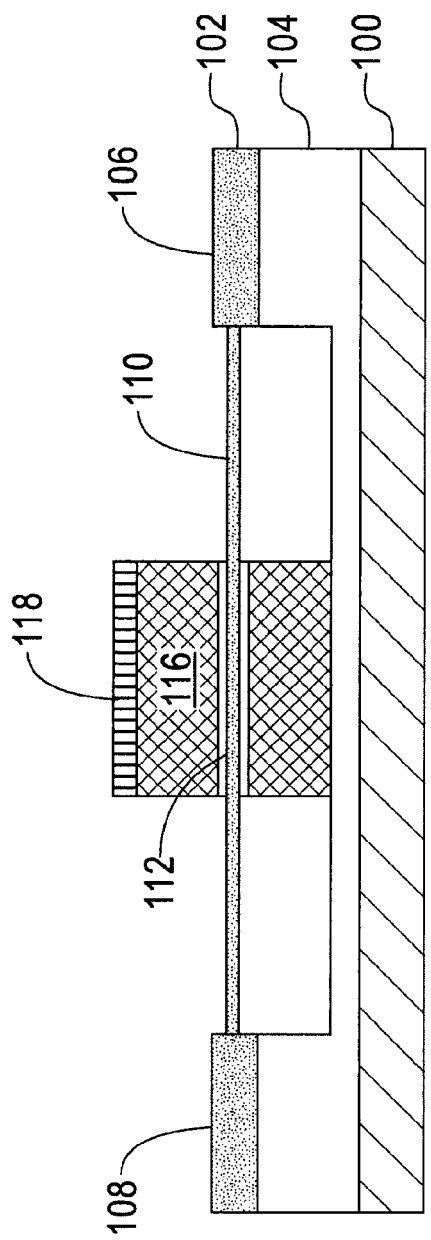

FIGS. 1-8 illustrate a cross-sectional views of a method for forming a FET device. Referring to FIG. 1, a silicon on insulator (SOI) layer 102 is defined on a buried oxide (BOX) layer 104 that is disposed on a silicon substrate 100. The SOI layer 102 includes a SOI pad region 106, a SOI pad region 108, and a silicon nanowire 110. A gate 112 is formed around a portion of the nanowire 110, and capped with a capping layer 116 that may include, for example, a polysilicon material. A hardmask layer 118 such as, for example, silicon nitride ($Si_3N_4$) is formed on the capping layer 116. The gate 112 may include layers of materials (not shown) such as, for example, a first gate dielectric layer (high K layer), such as silicon dioxide ($SiO_2$) around the nanowire 110, a second gate dielectric layer (high K layer) such as hafnium oxide ($HfO_2$) formed around the first gate dielectric layer, and a metal layer such as tantalum nitride (TaN) formed around the second gate dielectric layer.

Figure 2:
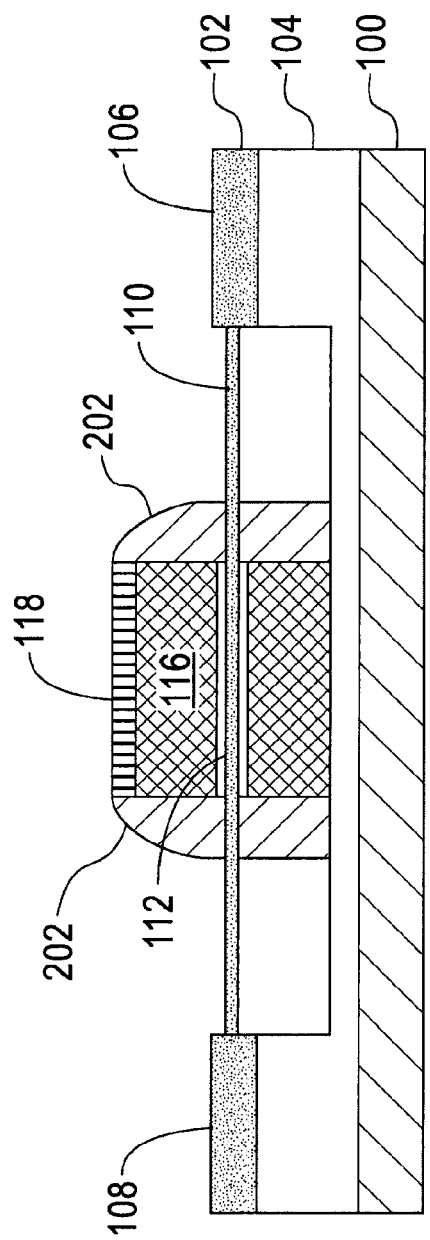

FIG. 2 illustrates spacer portions 202 formed along opposing sides of the capping layer 116. The spacers are formed by depositing a blanket dielectric film such as silicon nitride and etching the dielectric film from all horizontal surfaces by reactive ion etching (RIE). The spacer portions 202 are formed around portions of the nanowire 110 that extend from the capping layer 116 and surround portions of the nanowires 110.

Figure 3:
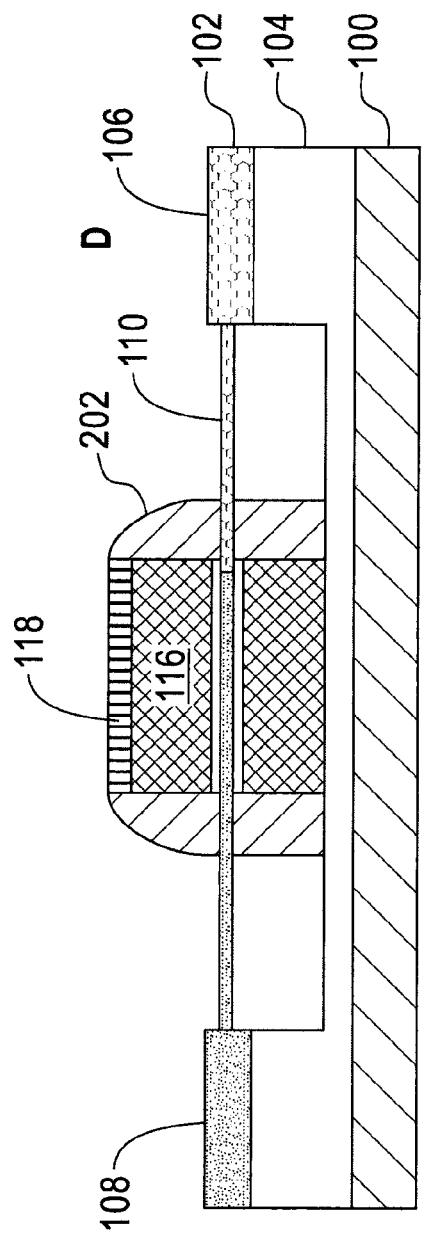

FIG. 3 illustrates the resultant structure following the implantation and activation of n-type ions in the SOI pad region 106 and the adjacent portion of the nanowire 110 that defines a drain region (D). The ions may be implanted by for example, forming a protective mask layer over the SOI pad region 108 and the adjacent nanowire 110 prior to ion implantation. Alternatively, the ions may be implanted at an angle such that the capping layer 116 and spacer 202 may absorb ions and prevent ions from being implanted in an undesired region.

Figure 4:
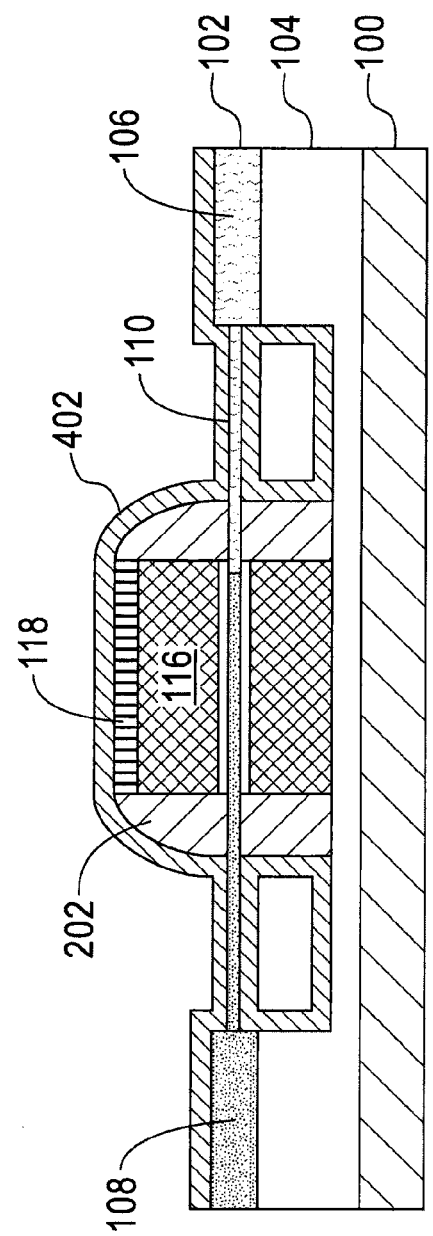

FIG. 4 illustrates the resultant structure following the formation of a conformal hardmask layer 402 over the exposed surfaces of the device. The conformal hardmask layer 402 may include for example, silicon dioxide, silicon nitride, or any other sacrificial material that will inhibit epitaxial growth and may be easily removed.

FIG. 5 illustrates the resultant structure following removal of a portion of the nanowire 110 that extended between the SOI pad region 108 and the channel region of the gate 112. The portion of the nanowire 110 may be removed by, for example, patterning and removing a portion of a portion of the conformal hardmask layer 402 and performing an etching process such as, for example, a wet chemical or vapor etching process that etches exposed silicon, and removes the exposed silicon nanowire 110. The portion of the conformal hardmask layer 402 is removed using a process that preserves the conformal hardmask layer 402 in the region that will become the drain region (described below); the removal process is controlled to avoid compromising the integrity of the hardmask layer 118 over the gate 112 and the integrity of the spacer 202.

FIG. 6 illustrates the resultant structure following an optional isotropic etching process may be performed to remove a portion of the nanowire 110 that is surrounded by the spacer wall 202 and the gate 112 to recess the nanowire 110 into the gate 112, and form a cavity 602 defined by the gate 112, the nanowire 110 and the spacer wall 202. Alternate embodiments may not include the isotropic etching process that forms the cavity 602. The lateral etching process that forms cavity 602 may be time based. Width variation in spacer 202 may lead to variations in the position of the edges of the recessed nanowire 110. The etching rate in the cavity 602 depends on the size of the cavity, with narrower orifice corresponding to slower etch rates. Variations in the nanowire size will therefore lead to variations in the depth of cavity 602.

Figure 7:
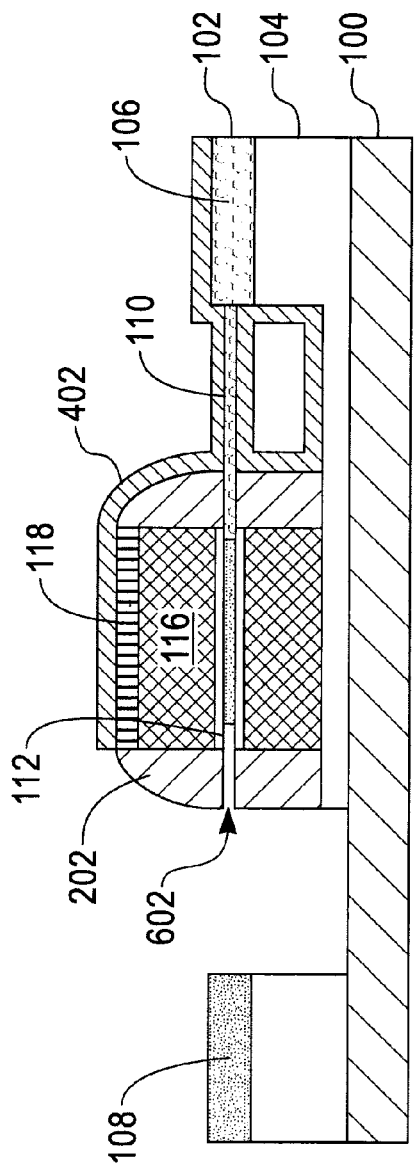

FIG. 7 illustrates the resultant structure following the removal of an exposed portion of the BOX layer 104 that exposes a portion of the silicon substrate 100.

Figure 8:
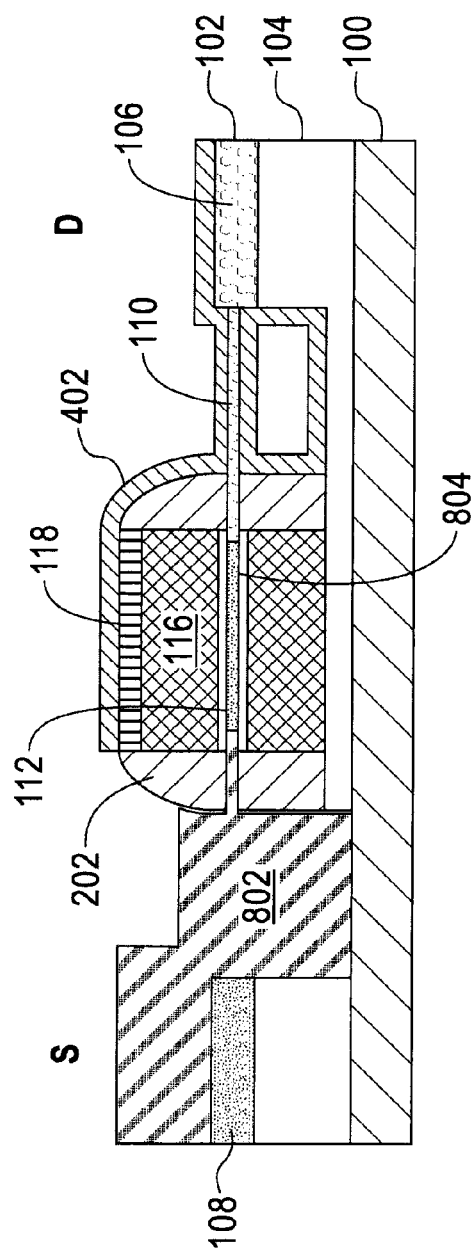

FIG. 8 illustrates cross-sectional views of the resultant structures following a selective epitaxial growth of silicon to form a source region (S) 802. The source region 802 is epitaxially grown in the cavity 602 (of FIG. 7) from the exposed nanowire 110 in the gate 112 to form the source region 802. The source region 802 is epitaxially grown from the SOI pad region 108 and the exposed portion of the silicon substrate 100. The source region 802 is formed by epitaxially growing, for example, in-situ doped silicon (Si), a silicon germanium (SiGe), or germanium (Ge) that may be p-type doped. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $B_2H_6$ for p-type doping. Deposition temperatures may range from 550° C. to 1000° C. for pure silicon deposition, and as low as 300° C. for pure Ge deposition.

Once source region (S) 802 is formed, the doping may be activated by, for example, a laser or flash anneal process. The laser or flash annealing may reduce diffusion of ions into the channel region 804 of the gate 112, and result in a high uniform concentration of doping in the source region 802 with an abrupt junction in the nanowires 110.

The hardmask layer 402 and 118 may be removed by, for example, a RIE process. A silicide may be formed on the source region 802 the drain region D and the gate region. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed and a conductive material such as, Al, Au, Cu, or Ag may be deposited to form contacts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A nanowire tunnel field effect transistor (FET) device, comprising:
    a channel region including a silicon portion having a first distal end and a second distal end, the silicon portion is surrounded by a gate structure disposed circumferentially around the silicon portion;
    a drain region including an n-type doped silicon portion extending from the first distal end;
    a cavity defined by the second distal end of the silicon portion and an inner diameter of the gate structure; and
    a source region including a doped epi-silicon portion epitaxially extending from the second distal end of the silicon portion in the cavity, a first pad region, and a portion of a silicon substrate.

2. The device of claim 1, wherein the n-type doped silicon portion is connected to a second pad region.

3. The device of claim 1, wherein the epi-silicon portion fills the cavity.

4. The device of claim 1, wherein the epi-silicon portion is uniformly doped.

5. The device of claim 1, wherein the epi-silicon portion is a SiGe alloy.

6. The device of claim 1, wherein the gate structure includes a first gate dielectric layer, a second gate dielectric layer arranged around the first gate dielectric layer, and a metal layer arranged around the second gate dielectric layer.

7. The device of claim 6, wherein the first gate dielectric layer and the second gate dielectric layer include high K materials.

8. A nanowire tunnel field effect transistor (FET) device, comprising:
 a channel region including a silicon portion having a first distal end and a second distal end, the silicon portion is surrounded by a gate structure disposed circumferentially around the silicon portion;
 a drain region including an n-type doped silicon portion extending from the first distal end, a portion of the n-type doped silicon portion arranged in the channel region;
 a cavity defined by the second distal end of the silicon portion and an inner diameter of the gate structure; and
 a source region including a doped epi-silicon portion epitaxially extending from the second distal end of the silicon portion in the cavity, a first pad region, and a portion of a silicon substrate.

9. The device of claim 8, wherein the n-type doped silicon portion is connected to a second pad region.

10. The device of claim 8, wherein the epi-silicon portion fills the cavity.

11. The device of claim 8, wherein the epi-silicon portion is uniformly doped.

12. The device of claim 8, wherein the epi-silicon portion is a SiGe alloy.

13. The device of claim 8, wherein the gate structure includes a first gate dielectric layer, a second gate dielectric layer arranged around the first gate dielectric layer, and a metal layer arranged around the second gate dielectric layer.

14. The device of claim 13, wherein the first gate dielectric layer and the second gate dielectric layer include high K materials.

15. A nanowire tunnel field effect transistor (FET) device, comprising:
 a channel region including a silicon portion having a first distal end and a second distal end, the silicon portion is surrounded by a gate structure disposed circumferentially around the silicon portion;
 a drain region including a doped silicon portion extending from the first distal end, a portion of the doped silicon portion arranged in the channel region;
 a cavity defined by the second distal end of the silicon portion and an inner diameter of the gate structure; and
 a source region including a doped epi-silicon portion epitaxially extending from the second distal end of the silicon portion in the cavity, a first pad region, and a portion of a silicon substrate.

16. The device of claim 15, wherein the doped silicon portion is connected to a second pad region.

17. The device of claim 15, wherein the epi-silicon portion fills the cavity.

18. The device of claim 15, wherein the epi-silicon portion is uniformly doped.

19. The device of claim 15, wherein the epi-silicon portion is a SiGe alloy.

20. The device of claim 15, wherein the gate structure includes a first gate dielectric layer, a second gate dielectric layer arranged around the first gate dielectric layer, and a metal layer arranged around the second gate dielectric layer.

* * * * *